US012001246B2

(12) United States Patent
Lai et al.

(10) Patent No.: US 12,001,246 B2
(45) Date of Patent: Jun. 4, 2024

(54) ALL-IN-ONE COMPUTER HAVING DISPLAYS WITH TOUCH CONTROL AND DISPLAY CONTROL METHOD BASED ON TOUCH CONTROL

(71) Applicant: ASUSTEK COMPUTER INC., Taipei (TW)

(72) Inventors: Yuni Lai, Taipei (TW); Jen-Chiu Chiang, Taipei (TW); Meng-Ru He, Taipei (TW); Chung-Shang Chi, Taipei (TW); Jia-Jung Kuo, Taipei (TW); Hsueh-Chih Tang, Taipei (TW); Shu-Yun Chen, Taipei (TW); Chun-Yen Huang, Taipei (TW); Chi-Rong Hsu, Taipei (TW); Yi-Ting Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/734,442

(22) Filed: May 2, 2022

(65) Prior Publication Data

US 2022/0350560 A1  Nov. 3, 2022

Related U.S. Application Data

(60) Provisional application No. 63/183,206, filed on May 3, 2021.

(30) Foreign Application Priority Data

Feb. 10, 2022 (TW) .................................. 111104840

(51) Int. Cl.
*G06F 1/16* (2006.01)
*G06F 3/041* (2006.01)
(Continued)

(52) U.S. Cl.
CPC .......... *G06F 1/1647* (2013.01); *G06F 1/1643* (2013.01); *G06F 1/1692* (2013.01);
(Continued)

(58) Field of Classification Search
CPC .... G06F 1/1647; G06F 1/1643; G06F 1/1692; G06F 3/0416; G06F 3/0488;
(Continued)

(56) References Cited

U.S. PATENT DOCUMENTS

2005/0114825 A1* 5/2005 Leung .................... G06F 1/1647
717/100
2007/0143518 A1* 6/2007 Kim ....................... G06F 1/1677
710/303
(Continued)

FOREIGN PATENT DOCUMENTS

CN    108628566 A    10/2018
CN    105739937 B     3/2020
(Continued)

OTHER PUBLICATIONS

"The world's first AiO with a customer-facing display | ASUS ExpertCenter E5 AiO Series," Product launch, Jun. 30, 2021, <https://www.youtube.com/watch?v=NbVPEx0M-yE>.

*Primary Examiner* — David D Davis
(74) *Attorney, Agent, or Firm* — Muncy, Geissler, Olds & Lowe, P.C.

(57) ABSTRACT

A display control method applicable to an all-in-one (AIO) computer is provided. The AIO computer includes a first monitor and a second monitor. The display control method includes: receiving a control instruction from the first monitor; projecting a display content on the second monitor according to the control instruction; and selectively enabling a touch control function of the second monitor according to the control instruction.

8 Claims, 8 Drawing Sheets

(51) Int. Cl.
   *G06F 3/0488* (2022.01)
   *G06F 3/14* (2006.01)
   *H05K 5/02* (2006.01)

(52) U.S. Cl.
   CPC .......... *G06F 3/0416* (2013.01); *G06F 3/0488* (2013.01); *G06F 3/1423* (2013.01); *H05K 5/0234* (2013.01)

(58) Field of Classification Search
   CPC .. G06F 3/1423; G06F 2200/1631; G06F 1/16; G06F 1/1605; G06F 1/1601; H05K 5/0234
   See application file for complete search history.

(56) References Cited

U.S. PATENT DOCUMENTS

| | | | | |
|---|---|---|---|---|
| 2007/0285340 A1* | 12/2007 | Leng | ..................... | G06F 3/1431 345/1.1 |
| 2010/0298032 A1* | 11/2010 | Lee | ..................... | G06F 1/1616 345/173 |
| 2011/0009169 A1* | 1/2011 | Kim | ..................... | G06F 3/04892 455/566 |
| 2011/0279393 A1* | 11/2011 | Okada | ..................... | G06F 3/0416 345/173 |
| 2012/0243165 A1* | 9/2012 | Chang | ..................... | G06F 1/1647 361/679.27 |
| 2013/0176237 A1* | 7/2013 | Chu | ..................... | G06F 1/1647 345/1.3 |
| 2013/0293444 A1* | 11/2013 | Sano | ..................... | G06F 1/3206 345/1.3 |
| 2013/0321288 A1* | 12/2013 | Adamson | ..................... | G06F 1/1616 345/173 |
| 2014/0327630 A1* | 11/2014 | Burr | ..................... | G06F 3/016 345/173 |
| 2017/0069255 A1* | 3/2017 | Honkanen | ..................... | G09G 3/002 |
| 2018/0275948 A1* | 9/2018 | Xu | ..................... | G06F 3/1454 |
| 2020/0133331 A1* | 4/2020 | Ferris | ..................... | H05K 5/0217 |
| 2020/0133336 A1* | 4/2020 | Wang | ..................... | G06F 1/169 |

FOREIGN PATENT DOCUMENTS

| | | |
|---|---|---|
| TW | 201033889 A | 9/2010 |
| TW | 202009679 A | 3/2020 |
| TW | 202009679 A | 3/2020 |

* cited by examiner

ALL-IN-ONE COMPUTER HAVING DISPLAYS WITH TOUCH CONTROL AND DISPLAY CONTROL METHOD BASED ON TOUCH CONTROL

CROSS-REFERENCE TO RELATED APPLICATION

This application claims the priority benefit of Taiwan Application Serial No. 111104840, filed on Feb. 10, 2022 and the priority benefit of U.S. Provisional Application Ser. No. 63/183,206, filed on May 3, 2021. The entireties of the above-mentioned patent applications are hereby incorporated by reference herein and made a part of specification.

BACKGROUND OF THE INVENTION

Field of the Invention

The disclosure relates to an all-in-one (AIO) computer, and particularly, to an AIO computer with dual monitors and a display control method thereof.

Description of the Related Art

Conventional AIO computers are often used in business, such as banks or restaurant counters, but usually require an external monitor or an input apparatus, to help customers to check information. Such a practice causes difficulties in computer installation and increases the costs of setup. In addition, the external monitor provides a limited quantity of functions, and usually, presents only preset display contents.

BRIEF SUMMARY OF THE INVENTION

The disclosure provides a display control method applicable to an AIO computer. The AIO computer includes a first monitor and a second monitor. The display control method includes: receiving a control instruction from the first monitor; projecting a display content on the second monitor according to the control instruction; and selectively enabling a touch control function of the second monitor according to the control instruction.

The disclosure further provides an AIO computer, including a first monitor, a second monitor, and a processing unit. The processing unit is electrically connected to the first monitor and the second monitor, and is configured to: receive a control instruction from the first monitor; project a display content on the second monitor according to the control instruction; and selectively enable a touch control function of the second monitor according to the control instruction.

According to the AIO computer and the display control method thereof provided in the disclosure, the display content and the touch control function of the second monitor are controlled by using the first monitor, and a required interactive function is provided by using the second monitor. In this way, other expansion apparatuses are omitted, thereby not only avoiding installation difficulties, issues of compatibility between software and hardware, and the like, but also facilitating interaction with customers during business use and enhancing the convenience.

DETAILED DESCRIPTION OF THE EMBODIMENTS

More detailed descriptions of the specific embodiments of the disclosure are provided below with reference to the accompanying drawings. The features and advantages of the disclosure are described more clearly according to the following description and claims. It is to be noted that all of the drawings use very simplified forms and imprecise proportions, only being used for assisting in conveniently and clearly explaining the objective of the embodiments of the disclosure.

Figure 1:
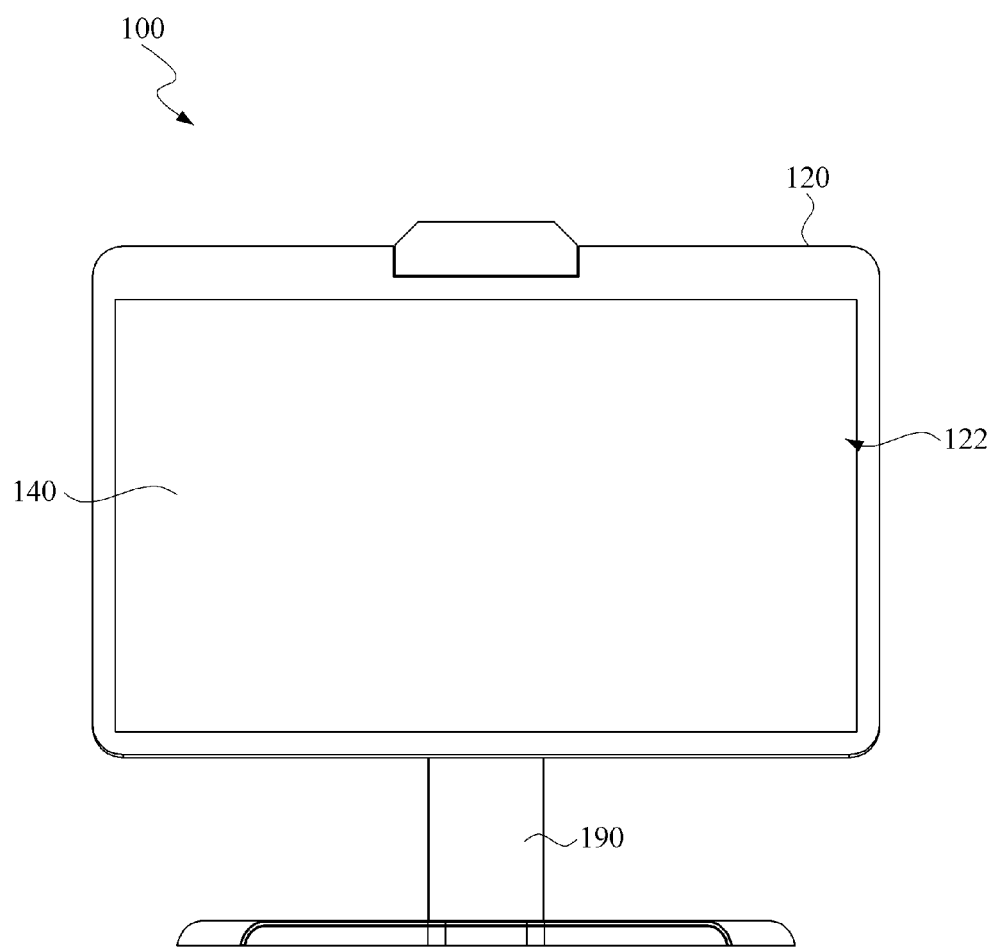
FIG. 1 to FIG. 3 are schematic perspective diagrams showing an MO computer according to an embodiment of the disclosure from different viewing angles.
Figure 2:
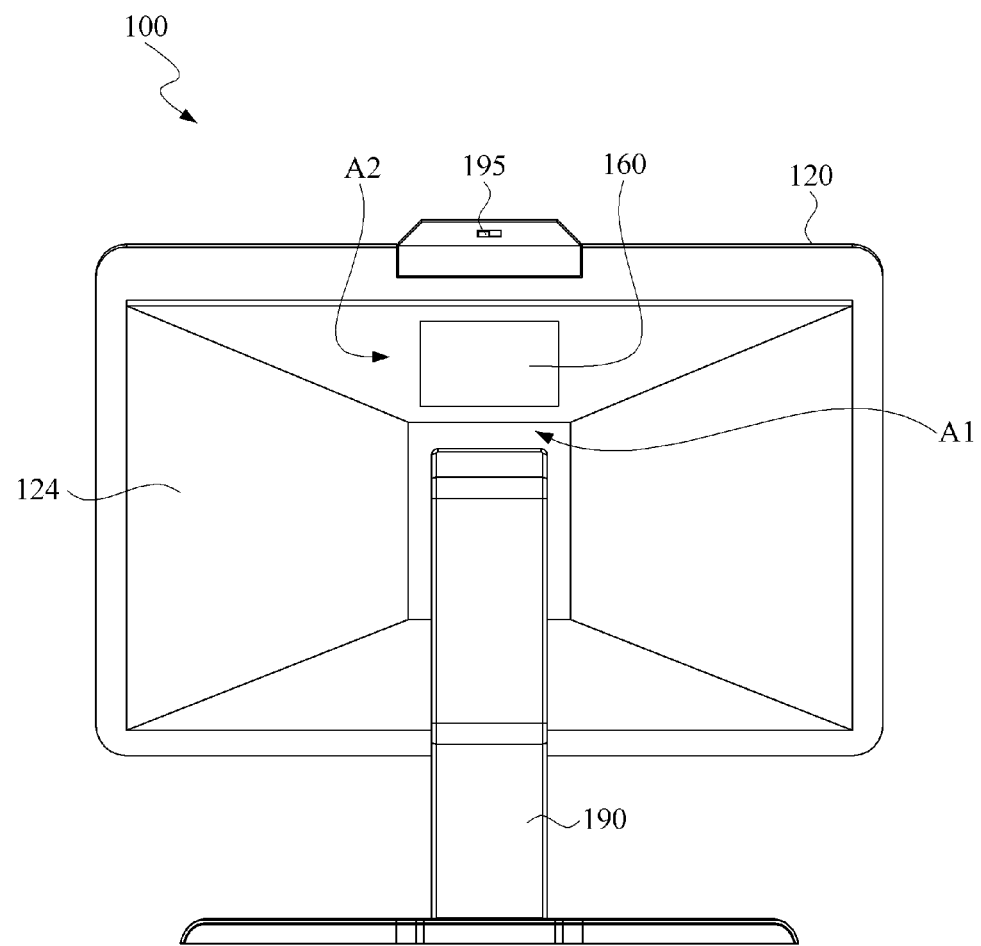
Figure 3:
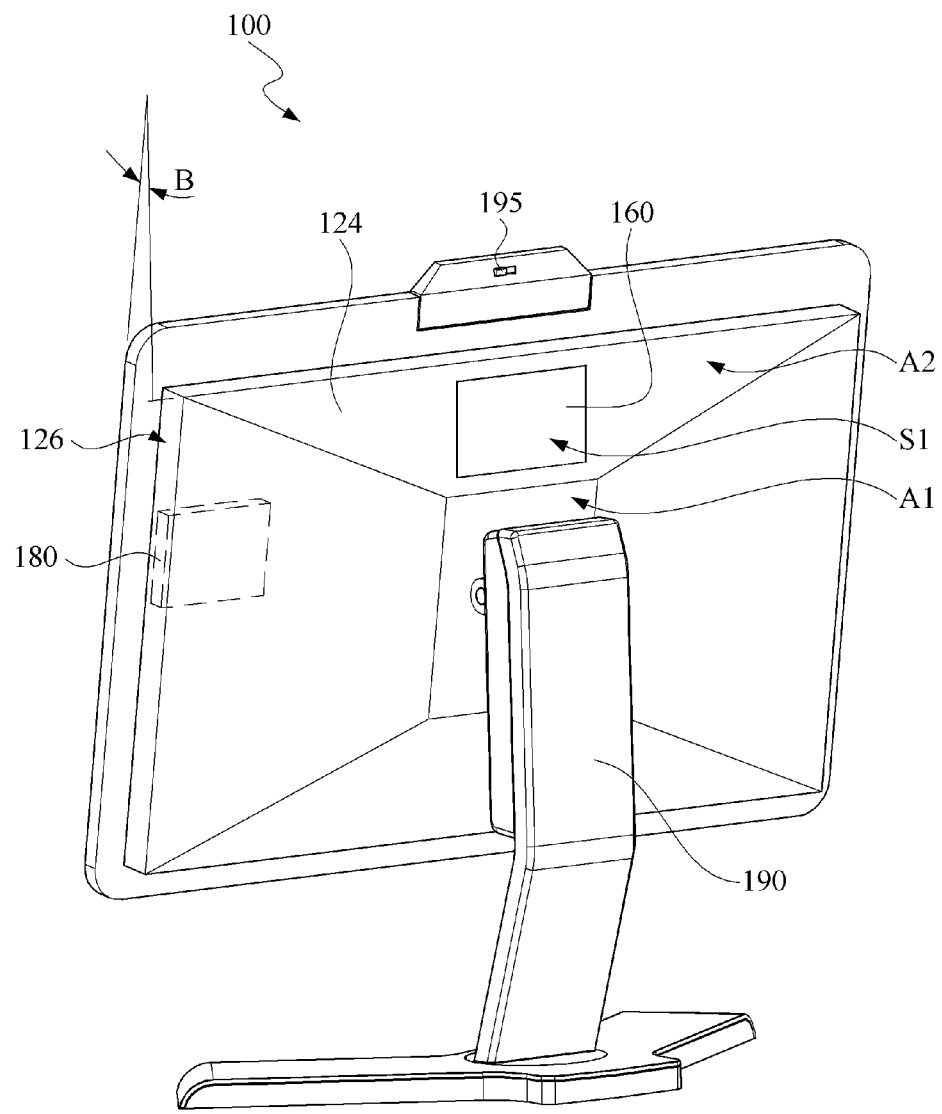

Referring to FIG. 1 to FIG. 3, the disclosure provides an AIO computer 100, including a main body 120, a first monitor 140, a second monitor 160, and a processing unit 180. The main body 120 includes a front surface 122 and a back surface 124. The first monitor 140 is arranged on the front surface 122. The second monitor 160 is arranged on the back surface 124. The processing unit 180 is arranged inside the main body 120.

The first monitor 140 serves as a main monitor of the AIO computer 100, and the second monitor 160 serves as a secondary monitor of the AIO computer 100. A size of the first monitor 140 is larger than that of the second monitor 160. In an embodiment, the first monitor 140 is a touch monitor, and the second monitor 160 is also a touch monitor.

As shown in the figure, the AIO computer 100 further includes a support frame 190. The support frame 190 is arranged under the main body 120, and is connected to the back surface 124 to support the main body 120. The second monitor 160 is arranged above a position at which the back surface 124 is connected to the support frame 190, which helps a user to view a content displayed on the second monitor 160 or to perform an operation by using the second monitor 160.

In an embodiment, referring to FIG. 2 and FIG. 3, the back surface 124 includes a connection region A1 and an inclined region A2. Both the connection region A1 and the inclined region A2 are planes. The connection region A1 is adapted to be connected to the support frame 190. The inclined region A2 is located above the connection region A1, and is connected to the connection region A1. A direction of the connection region A1 is substantially parallel to the front surface 122, and there is an angle B between the inclined region A2 and the front surface 122 (or the connection region A1). The angle B is between 0 degrees and 45 degrees.

The support frame 190 is connected to the connection region A1, and the second monitor 160 is arranged in the inclined region A2. When the AIO computer 100 in the disclosure is placed on a horizontal plane, the connection region A1 is a vertical plane, and the inclined region A2 is a region slightly upward, which is convenient for a user to check a content displayed on the second monitor 160 or perform touch input by using the second monitor 160.

The back surface 124 of the AIO computer 100 further includes an identification element 195, configured to identify an identity of the user. In an embodiment, as shown in the figure, the identification element 195 is a face identification element, and is arranged above the second monitor 160, to facilitate alignment with a face of the user. In another embodiment, the identification element 195 is alternatively a fingerprint identification element or another biological feature verification element.

In an embodiment, referring to FIG. 3, the inclined region A2 of the back surface 124 includes an accommodation space S1. The second monitor 160 is arranged inside the accommodation space S1. In another embodiment, the accommodation space S1 is also configured to accommodate other output/input elements such as a keyboard, a touchpad, a microphone, a speaker, and the like. In addition, to improve the flexibility in use, in an embodiment, the second monitor 160 is detachably arranged inside the accommodation space S1. The user arranges different output/input elements in the accommodation space S1 as required.

As shown in FIG. 3, the processing unit 180 of the AIO computer 100 is arranged at a position inside the main body 120 and near a side surface 126, and is located behind the first monitor 140. In another embodiment, the processing unit 180 is arranged at another position of the main body 120, or is even arranged inside the support frame 190.

In an embodiment, a connector is arranged on the side surface 126 of the main body 120. The connector is electrically connected to the processing unit 180 for the AIO computer 100 to be externally connected to another electronic component for expansion.

The processing unit 180 is a module providing computing power, and includes a central processing unit or a microcontroller. In another embodiment, the processing unit 180 further includes a mainboard, or the processing unit 180 is a mini computer.

Figure 4:
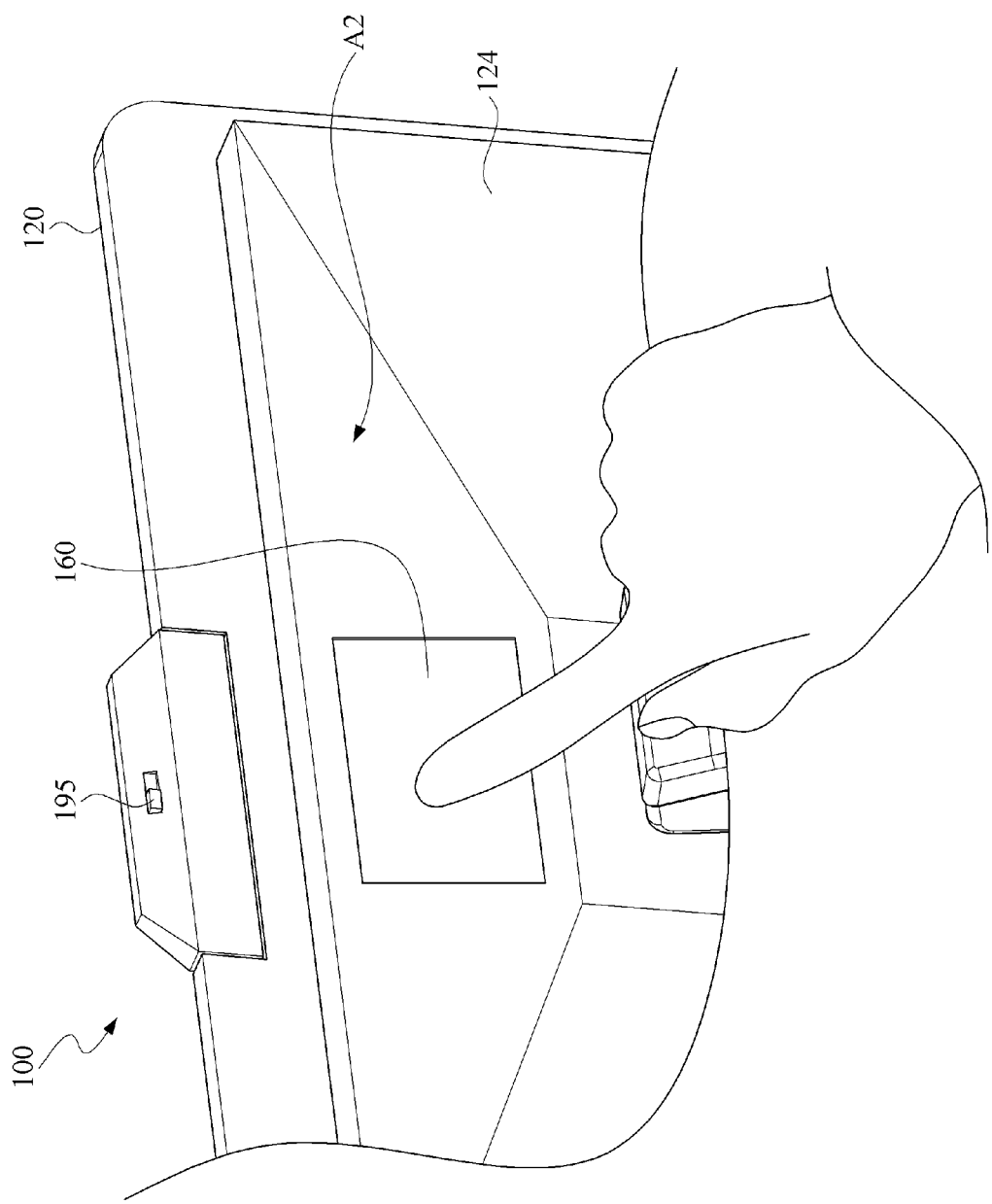
FIG. 4 is a schematic diagram of a use state of an AIO computer according to an embodiment of the disclosure.

FIG. 4 is a schematic diagram of a use state of an AIO computer according to an embodiment of the disclosure. The first monitor 140 and the second monitor 160 in the figure are both touch monitors. In an embodiment, the first monitor 140 and the second monitor 160 are both touch monitors. The processing unit 180 receives a first input instruction from the first monitor 140 on the front surface of the AIO computer 100 and a second input instruction from the second monitor 160 on the back surface of the AIO computer 100, and processes the first input instruction and the second input instruction to generate an output instruction. The output instruction is used for controlling a display content on the first monitor 140 or the second monitor 160, or the output instruction corresponds to a display content.

In an embodiment, at a checkout counter, a store owner enters, by using the first monitor 140, information (that is, the first input instruction) about goods purchased by a customer, and the customer enters a second input instruction by using the second monitor 160 to check the information about the goods or personal information. The processing unit 180 generates purchase information (that is, the output instruction) after performing processing, and the processing unit 180 presents the purchase information on the first monitor 140 and/or the second monitor 160.

In another embodiment, the AIO computer 100 is externally connected to an input element (not shown in the figure). In an embodiment, the input element is a keyboard, a touchpad, or a barcode reader. The processing unit 180 receives a third input instruction from the input element and the second input instruction from the second monitor 160, and processes the third input instruction and the second input instruction to generate an output instruction.

In an embodiment, at a checkout counter, a store owner reads, by using the barcode reader, information (the third input instruction) about a commodity purchased by a customer, the customer enters a second input instruction by using the second monitor 160 to check the information about the commodity or personal information, and the processing unit 180 generates purchase information (that is, the output instruction) after performing processing.

In an embodiment, the processing unit 180 receives the first input instruction from the first monitor 140 or the third input instruction from the input element, to generate an output instruction. The second monitor 160 presents a display content according to the output instruction.

In an embodiment, a store owner enters a discount code (the first input instruction) by using the first monitor 140 or enters a piece of lottery information (the third input instruction) by using a keyboard to the processing unit 180, the processing unit 180 generates an output instruction, and the second monitor 160 presents a piece of promotion information (the display content) according to the output instruction.

The AIO computer shown in FIG. 1 to FIG. 4 above is an AIO computer 100 with dual monitors. According to actual requirements, two or more monitors are arranged on the back surface 124 of the AIO computer 100. These monitors are arranged not only above a position at which the back surface 124 is connected to the support frame 190, but also on both sides of the position at which the back surface 124 is connected to the support frame 190.

Figure 5:
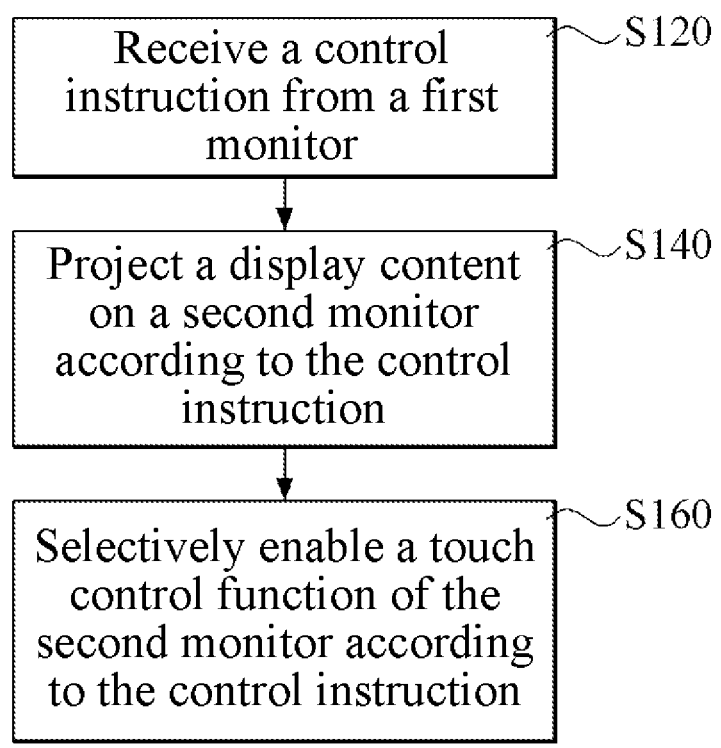
FIG. 5 is a flowchart of a display control method according to an embodiment of the disclosure.
Figure 6:
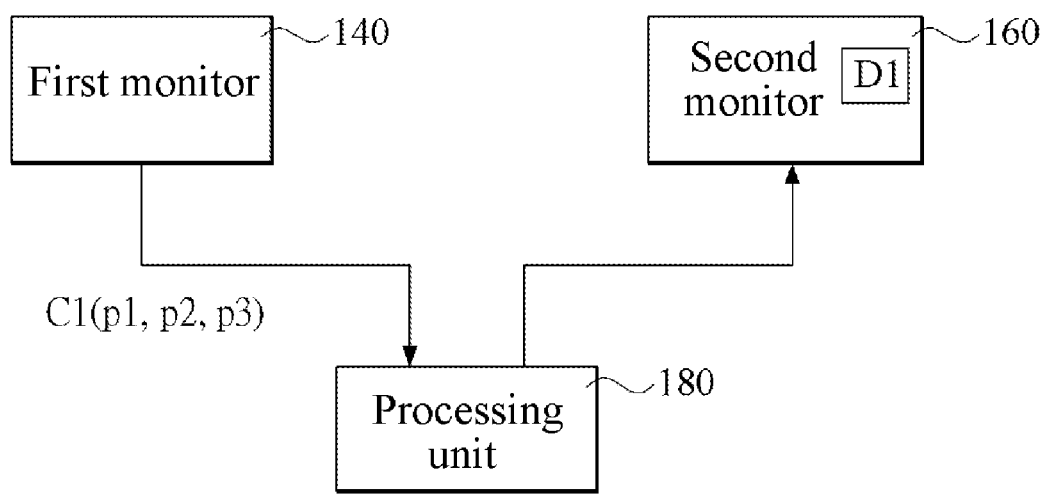
FIG. 6 is a block diagram of an AIO computer to which the display control method in FIG. 5 is applicable.

Referring to FIG. 5 and FIG. 6, the disclosure provides a display control method, including the following steps.

First, as described in step S120, a control instruction C1 is received from the first monitor 140. In an embodiment, the first monitor 140 is a touch monitor, and a user enters the control instruction C1 through a touch.

Then, as described in step S140, a display content D1 is projected on the second monitor 160 according to the control instruction C1. The second monitor 160 is a touch monitor.

In an embodiment, the control instruction C1 points to a video, one or more images, a text string, a barcode, all or a part of a real-time screen of the first monitor 140, an application window, or the like, and projects them as the display content D1 on the second monitor 160.

In an embodiment, when the display content D1 is all or a part of the real-time screen of the first monitor 140 or an application window on a desktop of the first monitor 140, the control instruction C1 simultaneously presents a prompt signal on the first monitor 140. In an embodiment, the control instruction C1 adds a preset color to a frame of a screen projected on the second monitor 160, to indicate that this part of the screen is being projected on the second monitor 160.

In an embodiment, the control instruction C1 projects an interactive interface, such as a numeric keypad or a handwriting interface, as the display content D1 on the second monitor 160. The interactive interface is pre-stored in a memory in the AIO computer 100.

In an embodiment, the control instruction C1 includes a dynamic effect parameter p1, for setting a dynamic effect of the to-be-presented display content D1. Using a text string as an example, a user edits the text string by using the first monitor 140 and uses the dynamic effect parameter p1 to set a to-be-presented dynamic effect of the text string on the second monitor 160, so that the text string is projected on the second monitor 160 according to the dynamic effect. This dynamic effect includes translation, rotation, zooming, color changing, text loop scrolling, and the like.

In an embodiment, the control instruction C1 includes a display time parameter p2, for setting a time when the display content D1 is displayed on the second monitor 160. In this manner, in step S140, a time when the display content D1 is projected on the second monitor 160 is controlled according to the display time parameter p2, to avoid the problem of data leakage caused by that private data is projected on the second monitor 160 for a long time. In an embodiment, when the display content D1 to be presented by the control instruction C1 involves personal information of a customer, the display time parameter p2 is also set.

Next, as described in step S160, a touch control function of the second monitor 160 is selectively enabled according to the control instruction C1.

In an embodiment, the control instruction C1 includes a touch control parameter p3, for determining whether to enable the touch control function of the second monitor 160. In an embodiment, the AIO computer 100 stores at least one interactive interface for a user to select as the display content D1.

When the display content D1 to be presented by the control instruction C1 is an interactive interface such as a numeric keypad or a handwriting interface, the touch control function of the second monitor 160 is enabled, to facilitate real-time interaction between an operator and a customer. Conversely, when the display content D1 to be presented by the control instruction C1 is a content that does not require interaction with a customer, such as screen sharing or advertisement information, original settings of the second monitor 160 are maintained, and the touch control function is not enabled.

The foregoing steps S120, S140, and S160 are performed by the processing unit 180 of the AIO computer 100.

Figure 7:
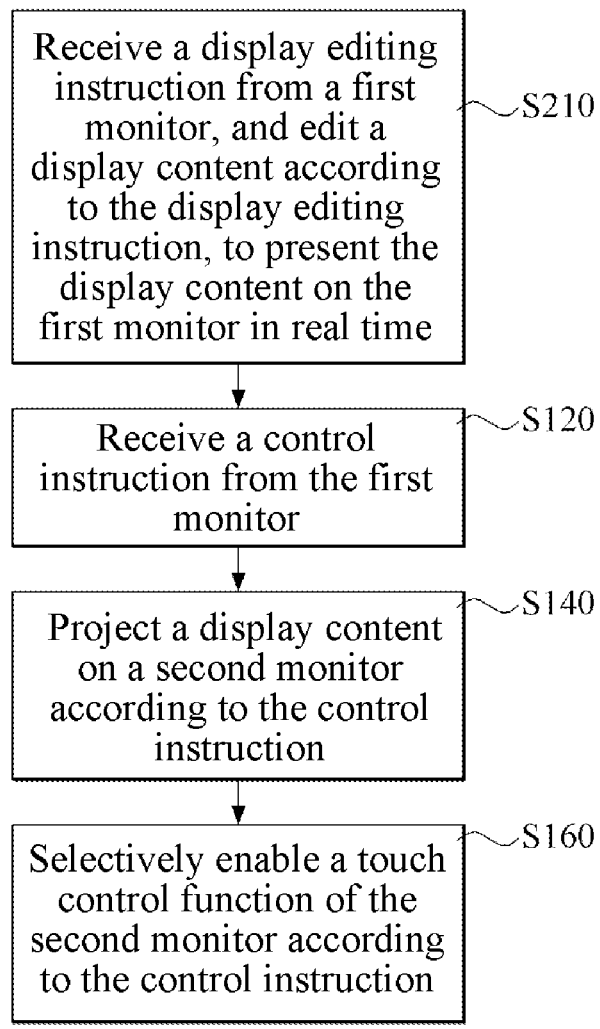
FIG. 7 is a flowchart of a display control method according to another embodiment of the disclosure.
Figure 8:
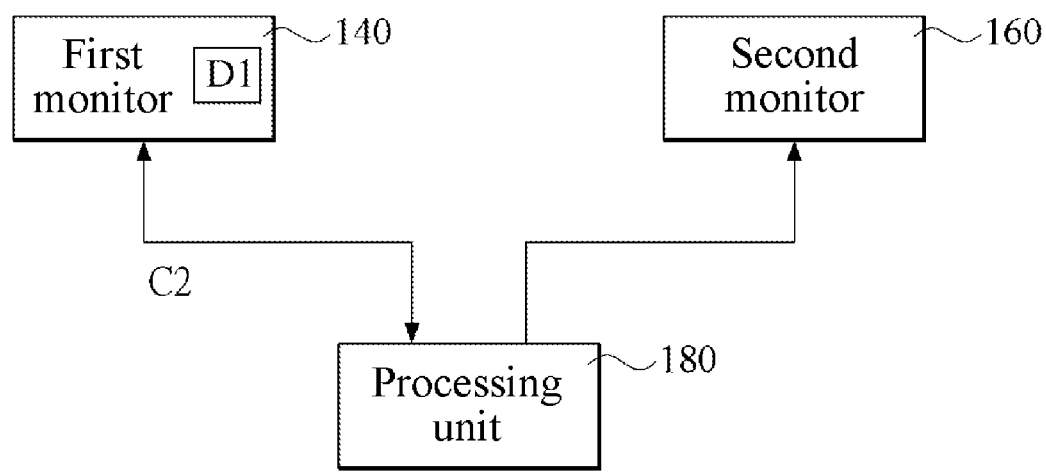
FIG. 8 is a block diagram of an AIO computer to which the display control method in FIG. 7 is applicable.

Referring to FIG. 7 and FIG. 8, before the receiving a control instruction C1, the display control method of this embodiment further includes an editing step S210. Step S210 is performed by the processing unit 180 of the AIO computer 100.

As shown in the figure, in step S210, a display editing instruction C2 is received from the first monitor 140, and the display content D1 is edited according to the display editing instruction C2 and presented on the first monitor 140 in real time, which helps a user to check the edited display content D1.

In an embodiment, the display editing instruction C2 is used for editing an image according to an aspect ratio of the second monitor 160 and presenting the image on the first monitor 140 in real time for the user to view. The edited image is stored in the AIO computer 100 as the display content D1.

In an embodiment, the display editing instruction C2 is used for converting a web address into a barcode and presenting the barcode on the first monitor 140 as the display content D1. In an embodiment, the display editing instruction C2 is used for enabling a text editing interface for the user to enter a text string and a corresponding dynamic effect, and presenting the text string and the corresponding dynamic effect on the first monitor 140 as the display content D1.

In an embodiment, the display editing instruction C2 is used for selecting a plurality of image files or screenshots, integrating the image files or screenshots into a video, and presenting the video on the first monitor 140 as the display content D1.

According to the AIO computer 100 and the display control method thereof provided in the disclosure, the first monitor 140 is used to control the display content D1 and touch control function of the second monitor 160, and the second monitor is used to provide a required interactive function. In this way, other expansion apparatuses are omitted, thereby not only avoiding installation difficulties, issues of compatibility between software and hardware, and the like, but also facilitating interaction with customers during business use and enhancing the convenience.

The above is merely exemplary embodiments of the disclosure, and does not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A display control method, applicable to an all-in-one computer, the all-in-one computer comprising a first monitor and a second monitor, wherein the second monitor comprises a touch control function, the display control method comprising:
   a step of receiving a control instruction from the first monitor;
   a step of projecting a display content on the second monitor according to the control instruction; and
   a step of selectively enabling the touch control function of the second monitor according to the control instruction,
   wherein the first monitor is a touch monitor, and the control instruction is entered through a touch to the first monitor,
   wherein the control instruction comprises a dynamic effect parameter, and the step of projecting the display content on the second monitor according to the control instruction comprises using the dynamic effect parameter to set a dynamic effect for the display content and projecting the display content on the second monitor,
   wherein the dynamic effect includes at least one of translation, rotation, zooming, color changing, and text loop scrolling,
   wherein before the step of receiving the control instruction from the first monitor, the method further comprises: receiving a display editing instruction from the first monitor,
   wherein the display editing instruction is used for editing an image according to an aspect ratio of the second monitor as the display content and presenting the image on the first monitor in real time, and
   wherein the display editing instruction is used for enabling an editing interface for the user to edit the corresponding dynamic effect parameter.

2. The display control method according to claim 1, wherein the step of selectively enabling the touch control function of the second monitor according to the control instruction comprises:
   enabling the touch control function of the second monitor when the display content is an interactive interface.

3. The display control method according to claim 2, wherein the interactive interface comprises at least one of a numeric keypad and a handwriting interface.

4. The display control method according to claim 1, wherein the display content is a video, an image, a text string or a barcode.

5. The display control method according to claim 1, wherein the display content is all or a part of a real-time screen of the first monitor or is an application window.

6. The display control method according to claim 1, wherein the control instruction comprises a display time parameter, and the step of projecting the display content on the second monitor according to the control instruction comprises controlling, according to the display time parameter, a time when the display content is projected on the second monitor.

7. The display control method according to claim 1, wherein the all-in-one computer comprises a front surface and a back surface, the back surface comprises an inclined region, an angle is formed between the inclined region and the front surface, the first monitor is arranged on the front surface, and the second monitor is arranged in the inclined region.

8. An all-in-one computer, comprising:
a first monitor;
a second monitor, comprising a touch control function; and
a processing unit, electrically connected to the first monitor and the second monitor, and configured to:
  receive a control instruction from the first monitor;
  project a display content on the second monitor according to the control instruction; and
  selectively enable the touch control function of the second monitor according to the control instruction,
wherein the first monitor is a touch monitor, and the control instruction is entered through a touch to the first monitor,
wherein the control instruction comprises a dynamic effect parameter, and the processing unit projects the display content on the second monitor according to the control instruction by using the dynamic effect parameter to set a dynamic effect for the display content and projecting the display content on the second monitor,
wherein the dynamic effect includes at least one of translation, rotation, zooming, color changing, and text loop scrolling,
wherein before the processing unit receives the control instruction from the first monitor, the processing unit receives a display editing instruction from the first monitor,
wherein the display editing instruction is used for editing an image according to an aspect ratio of the second monitor as the display content and presenting the image on the first monitor in real time, and
wherein the display editing instruction is used for enabling an editing interface for the user to edit the corresponding dynamic effect parameter.

* * * * *